(12) United States Patent
Chen et al.

(10) Patent No.: US 8,245,106 B2
(45) Date of Patent: Aug. 14, 2012

(54) METHOD FOR ERROR CORRECTION AND ERROR DETECTION OF BINARY DATA

(75) Inventors: Xiao-Ming Chen, Hannover (DE); Oliver Theis, Hannover (DE); Marco Georgi, Langenhagen (DE)

(73) Assignee: Thomson Licensing, Boulogne-Billancourt (FR)

( * ) Notice: Subject to any disclaimer, the term of this patent is extended or adjusted under 35 U.S.C. 154(b) by 416 days.

(21) Appl. No.: 12/587,419

(22) Filed: Oct. 7, 2009

(65) Prior Publication Data

US 2010/0269025 A1  Oct. 21, 2010

(30) Foreign Application Priority Data

Oct. 16, 2008  (EP) .................................... 08305690

(51) Int. Cl.
*G06F 11/00* (2006.01)
(52) U.S. Cl. ........................................ 714/758; 714/785
(58) Field of Classification Search .................. 714/752, 714/758, 781, 785
See application file for complete search history.

(56) References Cited

U.S. PATENT DOCUMENTS

| | | | | |
|---|---|---|---|---|
| 4,556,977 | A | 12/1985 | Olderdissen et al. | |
| 5,271,012 | A * | 12/1993 | Blaum et al. | 714/6.24 |
| 5,351,246 | A * | 9/1994 | Blaum et al. | 714/6.21 |
| 5,644,695 | A | 7/1997 | Blaum et al. | |
| 6,961,888 | B2 * | 11/2005 | Jin et al. | 714/752 |
| 7,178,082 | B2 * | 2/2007 | Yu et al. | 714/752 |
| 7,234,098 | B2 * | 6/2007 | Eroz et al. | 714/758 |
| 7,543,212 | B2 * | 6/2009 | Miles et al. | 714/752 |
| 8,020,063 | B2 * | 9/2011 | Olaker et al. | 714/755 |
| 8,065,598 | B1 * | 11/2011 | Gunnam et al. | 714/800 |
| 8,069,390 | B2 * | 11/2011 | Lin | 714/758 |
| 2008/0126908 | A1 * | 5/2008 | Lin | 714/758 |

OTHER PUBLICATIONS

Hachiro Fujita et al.: Modified Low-Density MDS Array Codes for Tolerating Double Disk Failures in Disk Arrays: IEEE Transactions on Computers, IEEE Service Center, Los Alamitos, CA, US. vol. 56, No. 4, Apr. 1, 2007 pp. 563-566.
Mario Blaum et al.: "MDS Array Codes with Independent Parity Symbols" IEEE Transactions on Information Theory, IEEE, US, vol. 42, No. 2, Mar. 1, 1996 p. 534.
Mario Blaum et al.: "On Lowest Density MDS Codes" IEEE Transactions on Information Theory, IEEE, US vol. 45, No. 1, Jan. 1, 1999 p. 53.
Jun Xu et al.: "Construction of Regular and Irregular LDPC Codes: Geometry Decomposition and Masking" IEEE Transactions on Information Theory, IEEE, US. vol. 43, No. 1, Jan. 1, 2007 p. 123.
Search Report dated Mar. 12, 2009.
Easily Decodable Efficient Self-Orthogonal Block Codes, Electronic Letters, Mar. 31, 1977 vol. 13, No. 7.
Low-Density Array Codes Correcting Module and Burst Errors, 0005-1179192/5304-0607$12.50m 1992 Plenum Publishing Corporation, Minsk Polytechnical Institute Translated from Avtomatika, No. 4, pp. 155-163, Apr. 1992.
Soft-Decoding of Several Classes of Array Codes, Mario Blaum et al. Oct. 20, 2001, pp. 1-6.

* cited by examiner

*Primary Examiner* — Marc Duncan
(74) *Attorney, Agent, or Firm* — Robert D. Shedd; Jeffrey M. Navon; Jerome G. Schaefer

(57) ABSTRACT

For algebraic single symbol error correction and detection, a method is proposed which achieves correcting single symbol errors at unknown positions within codewords, identifying cases where multiple symbols within a codeword are uncorrectably corrupted, and identifying cases where a single symbol within a codeword is uncorrectably corrupted. The method comprises the steps of calculating a syndrome of a received word, splitting the syndrome into two parts, checking 3 integer weight quantities calculated from the two syndrome parts, converting the syndrome into a vector of integer valued "orthogonal bit error weights" associated to the received bits, and toggling those bits of the received word, where the associated "orthogonal bit error weight" is in the upper half of its possible value range.

2 Claims, No Drawings

METHOD FOR ERROR CORRECTION AND ERROR DETECTION OF BINARY DATA

This application claims the benefit, under 35 U.S.C. §119 of EP Patent Application 08305690.3, filed Oct. 16, 2008.

FIELD OF THE INVENTION

The invention relates to the field of error correction codes (ECC) for optical storage systems. It may also be applied to magnetic recording storage devices, Redundant Array of Independent Disk (RAID) systems, and transmission systems.

BACKGROUND OF THE INVENTION

H. Fujita et al: "Modified low-density MDS array codes for tolerating double disk failures in disk arrays", IEEE trans COMP-56, pp. 563-566 present a new class of low-density MDS array codes for tolerating double disk failures in disk arrays. The proposed MDS array code has lower encoding and decoding complexity than the EVENODD code of Blaum et al.

A single error correcting code has been disclosed in M. Blaum "A CODING TECHNIQUE FOR RECOVERY AGAINST DOUBLE DISK FAILURE IN DISK ARRAYS" in 1992. See also U.S. Pat. No. 5,271,012 or EP 0 519 669, respectively. These codes have minimum distance 3 and can therefore correct any single symbol error.

Blaum's decoding method has been disclosed in U.S. Pat. No. 5,644,695. It relies on generalized Array Codes as presented in US. Pat. No. 5,351,246 and includes U.S. Pat. No. 5,271,012 as well.

SUMMARY OF THE INVENTION

An approach of efficiently encodable quasi-cyclic error correcting codes will be named "zArray Codes" in the following. zArray codes are based on the known "array codes" as published in R. J. G. Smith, "Easily Decodable Efficient Self-Orthogonal Block Codes", Electronics Letters, Vol 13 No. 7, pp 173-174, 1977. zArray codes constitute, in a systematic way, ECC codes of type LDPC or Low Density Parity Check, which are, on one hand, efficiently encodable even at large codeword length, and, on the other hand, have a good performance when decoded using message passing algorithms.

A parity check matrix of a zArray code is defined and generated by the following steps: A first intermediate matrix H1 is generated so as to comprise two rows of square, identically sized, binary sub-matrices, where the first row comprises p identity matrices I of size p·p, and the second row comprises p increasing powers a' of a cyclic shift matrix σ of size p·p, wherein u=0, ..., p−1. From the first intermediate matrix H1, a second intermediate matrix H2 is generated by removing m equidistant columns from each of the sub-matrices of the first intermediate matrix H1 at column indices [r+2ri+i+q] modulo p, wherein i,m,p,q are integers, wherein i=0, ..., m−1, wherein m,p,q,r are predefined such that p=m+2mr, and wherein column indices within the sub-matrices start with 0. The result of applying this column removal to a submatrix corresponding to σ" will be denoted as σ'", in the following. From the second intermediate matrix H2, a third intermediate matrix H3 is generated by deleting those matrix rows from the first row of sub-matrices of the second intermediate matrix H2 which, due to the removing step, contain only zeros. As a consequence of this deleting, the first row of the third intermediate matrix H3 comprises p small identity matrices Is of size (p−m)·(p−m). From the third intermediate matrix H3, the parity check matrix H of the zArray code is generated by prepending m−1 binary column vectors of height 2p−m having weight 2, wherein the column vectors have "1" elements in the middle rows of those row ranges where the juxtaposition of the sub-matrices [σ⁰σ¹] has row weight 2. The latter mentioned binary column vectors are together named the "z" matrix, hence the name of zArray codes.

In the following, we denote as a "symbol" of a zArray codeword the tuple of those p−m bits that correspond to those columns of the parity check matrix H that contain the columns of one of the cyclic shift submatrices σ" after column removal. Further, we denote as "symbol x" or "the x-th symbol" that one of the tuples, which corresponds to the columns of σ^(x−1). Note that in this nomenclature, because of their number, the m−1 leftmost bits of a codeword, corresponding to the z matrix part of the parity check matrix H, are in general not considered a symbol.

Advantages of zArray codes over Array codes:
 By being column regular, zArray codes enable for a better message passing decoding performance than the column-irregular Array codes.
 zArray codes maintain an encoding time that grows linearly with codeword length.
 zArray codes allow parity bit generation, i.e. encoding, to be split into an adjustable number of independent sequential tasks, enabling parallelization of the encoding process.

zArray Codes are designed for efficient encodability and good message passing decoding performance. However, message passing decoding is justified only when errors are reflected by low bit reliabilites for the received codeword. This might not be the case for burst error (or erasures representing burst error with known position) or shot noise events. In case of a single symbol error comprising multiple corrupted bits within a same symbol, message passing decoding will likely fail to find the correct codeword especially if the error is caused by some form of short error burst. Then algebraic symbol error decoding for a potential single symbol error can be carried out.

While most of the codewords of zArray codes have minimum distance 3, a few of them have minimum distance 2, so that with zArray coding, not all single symbol errors are correctable.

With respect to decoding zArray coded data,
 For random bit errors, message passing decoding can advantageously be used;
 At least for a subclass of zArray codes, single and double erasures (erroneous symbols at known positions within the codeword) can be corrected using a modification of a processing step from zArray encoding. This exploits the structure of the subclass.
 For the situation of short burst errors, i.e. when a single symbol at an unknown position within the codeword has several of its bits corrupted, an efficient decoding (i.e. correcting) method is so far lacking.

Solutions from prior art, namely U.S. Pat. No. 5,271,012/ EP0519669, U.S. Pat. No. 5,644,695 and U.S. Pat. No. 5,351, 246 involve different codes which do not have the feature of allowing parallelized encoding.

The present invention provides an algebraic single symbol error correction and error detection method. The term "algebraic decoding" is known in the field of error correction to refer to decoding methods where the correct data are being "calculated" from some given data, as compared to the iterative methods known as "message passing", where the given erroneous data asymptotically converge into the correct data under the method. The present invention proposes and describes, that, on zArray coded data, a modification of the "Majority Logic Decoding" known from prior art can efficiently be used for the following tasks:

correcting a single symbol error (at unknown position) within a codeword;
 identifiying cases where multiple symbols within a codeword are uncorrectably corrupted;
 identifying those (few) cases where a single symbol within a codeword is uncorrectably corrupted.

The method according to the invention involves the following steps:

calculating the syndrome of the received word,
 splitting the syndrome into two parts,
 checking 3 integer weight quantities calculated from the two syndrome parts,
 converting the syndrome into a vector of integer valued "orthogonal bit error weights" associated to the received bits,
 toggling those bits of the received word, where the associated "orthogonal bit error weight" is in the upper half of its possible value range.

Advantage:

Complements other, previously invented decoding methods for zArray coded data. Used together, these decoding techniques cover many if not most decoding scenarios that are important in practice.

The method is an advantageous alternative to the decoding method of U.S. Pat. No. 5,644,695 when used on zArray coded data.

The invention solves the problem of correcting a single symbol error within a zArray codeword. A method for correcting a single symbol error within a zArray codeword is proposed. The method uses an extended majority logic decoding process. Beyond this, multiple symbol errors and uncorrectable single symbol errors will be identified and marked as uncorrectable. zArray Codes have a minimum symbol distance $d_{min}=2$. Therefore, depending on the number of erroneous bits in the symbol, single symbol error correction can not be guaranteed since locating the symbol error position is not always feasible. Therefore provisions are taken to at least identify all uncorrectable symbol error events. It will be shown that the mentioned design parameter "p" of zArray codes can be used to lower the probability of these events. Furthermore most multiple symbol errors will be identified.

The advantages of the methods according to the invention are:

In case that multiple bits of a single zArray code symbol have been corrupted, error correction probability for the extended majority logic decoding method according to the invention is much higher than that of soft decision message passing decoding.
 Compared to soft decision message passing decoding, the decoding method according to the invention is less complex, thereby needing fewer processing resources. This is due to its hard-decision, non-iterative nature.
 In contrast to U.S. Pat. No. 5,644,695, the decoding method according to the invention is aware of uncorrectable symbol error events. For Array Codes with a minimum symbol distance of 3, all single symbol errors are correctable. The advantages of zArray Codes over Array Codes have been pointed out above.

According to the invention, error correction and error detection of binary data organized in words comprises the steps of:

calculating, from a received word r', a binary syndrome vector s;
 splitting the syndrome vector s into a first subvector s0 and a second subvector s1;
 calculating a first error weight ws0 from the first subvector s0, and calculating a second error weight ws1 and a third error weight ws1' from the second subvector s1;
 converting the syndrome vector s into an orthogonal bit error weight vector eow;
 deriving, from the orthogonal bit error weight vector eow, a majority error vector emaj via majority decision;
 computing, from the majority error vector emaj, a vector of symbol error weights esym associated to symbols of the received word;
 deriving, from the vector of symbol error weights esym, the number of potential symbol errors nsym;
 correcting those received words r' where nsym=1 was derived, by bitwise XOR operation with the first subvector s0.

DETAILED DESCRIPTION

A symbol of a zArray codeword with index x=1, . . . p is defined to be a tuple comprising those p−m bits of the zArray codeword that are being multiplied, for parity check, with the submatrices Is and $\sigma^{(x-1)}$, of the parity check matrix H of the zArray code, respectively.

zArray codes in many cases allow to correct a single symbol error by applying an extended majority logic decoding strategy. A single symbol error is defined to corrupt at least 1 of the p−m bits of a symbol. Multiple symbol errors are uncorrectable. It is assumed that the kind of error event is unknown prior to decoding.

Extended Majority Logic Decoding for Single Symbol Error Correction

In the following, the parity check matrix of the zArray code, so far denoted as "H", will be denoted as $H_{mz}$.

Step 1: Compute, in GF2, the syndrome $s=r'H^T_{mz}$ from the received vector (also denoted as received word) r'.

Step 2: Check the syndrome: If s=0 holds, the received vector r' is believed to equal a sent codeword v; break.

Note that the following steps will only be executed for the non-zero syndrome case.

Step 3: Extract $s_0$ from those p−m bits of s that correspond to the upper p−m rows of $H_{mz}$.

Extract $s_1$ from those p bits of s that correspond to the lower p rows of $H_{mz}$, such that $s=[s_0 s_1]$.

Step 4: Compute integer valued error weights $w_{s0}$ and $w_{s1}$ by summing up set bits in $s_0$ and $s_1$:

$$w_{s0} = \sum_{i=0}^{p-m-1} s_0(i)$$

$$w_{s1} = \sum_{i=0}^{p-1} s_1(i).$$

Compute $w_{a1'}$ by summing up set bits in $s_1$ while ignoring those elements of $s_1$ calculation of which involved, in step 1, a "1" element in the z matrix part of $H_{mz}$:

$$w_{s1'} = \sum_{\substack{i=0 \\ i \neq j(2r+1)}}^{p-1} s_1(i)$$

Step 5: Check error weight equality: If $w_{s0} \neq w_{s1}$, a non single symbol error has been detected; break with the following options:

Option 5a: If $w_{a0}=w_{s1'}=0$, this indicates that in r', only the part associated with the z matrix part of H is erroneous, whereas the information part u' and the other parity bits of r' are error free. Reconstruction of $v_{par1}$ is possible in this case, but probably of no interest.

Option 5b: Otherwise an uncorrectable multiple symbol error has been detected.

Step 6: Compute an orthogonal bit error weight vector $e_{ow}$ with a conventional (i.e. non-GF2) matrix multiplication:

$e_{ow} = sH_{mz}$ $e_{ow}$ is of the same dimensionality as r'. Because of the column weight of $H_{mz}$ and the non-GF2 multiplication, the elements of $e_{ow}$ are $\in \{0, 1, 2\}$.

Step 7: Majority decode the components of the orthogonal bit error weight vector $e_{ow}$ into a majority error vector $e_{maj}$, assuming the number of maximal orthogonal errors is J. (Orthogonality is defined according to Section 17.6.1 on page 872 in "Error Control Coding" by Lin, Costello.) That means that for each element n of $e_{ow}$, a 1 is decoded if $e_{ow}(n) > \lfloor J/2 \rfloor$, otherwise a 0 is decoded. For zArray codes, where J=2, the majority error vector can therefore be written as $e_{maj} = \lfloor e_{ow}/2 \rfloor$.

The elements of $e_{maj}$ are $\in \{0, 1\}$.

(Steps 6 & 7 are the traditional well known majority logic decoding steps from which $r = r' \oplus e_{maj}$ can be decoded.)

Step 8: Compute the p symbol error weights for each symbol index $x=1, \ldots, p$ by counting the "1" elements of the majority error vector within each symbol:

$$e_{sym}(x) = \sum_{i=(x-1)(p-m)+z+1}^{x(p-m)+z} e_{maj}(i)$$

This neglects those z majority errors from $e_{maj}$ that correspond to the z matrix part of $H_{mz}$, since they do not define a symbol per definition.

Step 9: Check for each symbol x if $e_{sym}(x)=w_{s0}$. The error weight $w_{s0}$ is the maximum symbol error weight that can occur.

$e_{ws0} = \lfloor e_{sym}/w_{s0} \rfloor, \in \{0, 1\}$ $e_{ws0}(x)=1$ indicates a potential error at symbol index x.

(This step might be interpreted as a second symbol based majority logic decoding step, but should not be confused with traditional two-step majority logic decoders.)

Step 10: Count the number of potential symbol errors:

$$n_{sym} = \sum_{x=1}^{p} e_{ws0}(x).$$

Step 11: Check for uncorrectable single or multiple symbol errors.
a. If $n_{sym}=0$, multiple symbol errors have been detected. Errors in the received vector r' are not correctable;
b. If $n_{sym}>1$, a single but uncorrectable symbol error has been detected.
Errors in the received vector r' are not correctable;

Step 12: $n_{sym}=1$. Correct the single symbol error, corresponding to the symbol index $x_{def}$ for which $e_{ws0}(x_{def})=1$ holds, by XOR-ing the erroneous symbol of the received vector r' with $s_0$, to receive r.
Notice that $s_0 = e_{maj}((x_{def}-1)(p-m)+z+1: x_{def}(p-m)+z)$ holds.

(Steps 8.-12. are Considered to be the Extension Steps)

The extended majority logic decoding according to this invention may also be applied to Blaum's Array Codes according to U.S. Pat. No. 5,271,012 for single symbol error correction. There, Step 5 can be left out, because that code does not have the $v_{par1}$ part. Also, the condition $n_{sym}>1$ in option b. of Step 11 will never hold since Array Codes do not suffer from uncorrectable single symbol errors.

With other words, for algebraic single symbol error correction and detection, a method is proposed which achieves correcting single symbol errors at unknown positions within codewords, identifiying cases where multiple symbols within a codeword are uncorrectably corrupted, and identifying cases where a single symbol within a codeword is uncorrectably corrupted. The method comprises the steps of calculating a syndrome of a received word, splitting the syndrome into two parts, checking 3 integer weight quantities calculated from the two syndrome parts, converting the syndrome into a vector of integer valued "orthogonal bit error weights" associated to the received bits, and toggling those bits of the received word, where the associated "orthogonal bit error weight" is in the upper half of its possible value range.

The invention claimed is:
1. A method for error correction and error detection of binary data that have been error correction encoded by an LDPC code the parity check matrix of which is equal to the result of the steps of:
generating a first intermediate matrix comprising two rows of square, identically sized, binary sub-matrices, where the first row comprises p identity matrices of size p·p, and the second row comprises p increasing powers of a cyclic shift matrix of size p·p;
generating from the first intermediate matrix a second intermediate matrix by removing m equidistant columns from each of the sub-matrices of the first intermediate matrix at column indices [r+2ri+i+q] modulo p, wherein i,m,p,q are integers, wherein i=0, . . . , m−1, wherein m,p,q,r are predefined such that p=m+2mr, and wherein column indices within the sub-matrices start with 0;
generating a third intermediate matrix from the second intermediate matrix by deleting is those matrix rows from the first row of sub-matrices of the second intermediate matrix H2 which contain only zeros;
prepending to the third intermediate matrix m−1 binary column vectors of height 2p−m having "1" elements in the middle rows of those row ranges where the 0-th power of the shift matrix juxtaposed to the 1st power of the shift matrix have row weight 2;

the binary data being organized in words, the words comprising symbols, the method having the steps of:

calculating, from a received word and the parity check matrix of the LDPC code, a binary syndrome vector;

splitting the syndrome vector into a first subvector and a second subvector;

calculating a first error weight from the first subvector, and calculating a second error weight and a third error weight from the second subvector;

converting the syndrome vector into an orthogonal bit error weight vector;

deriving, from the orthogonal bit error weight vector, a majority error vector via majority decision;

computing, from the majority error vector, a vector of symbol error weights associated to the symbols of the received word;

deriving, from the vector of symbol error weights, the number of potential symbol errors;

correcting those received words where the number of potential symbol errors was derived as 1, by bitwise XOR operation with the first subvector.

2. A method according to claim 1, wherein the first subvector comprises p−m bits of the syndrome, and the second subvector comprises p bits, and wherein the third error weight is derived from the second subvector by counting its set bits except at elements $2rj+j$.

* * * * *